(12) United States Patent
Hasegawa (10) Patent No.: US 6,560,778 B1
(45) Date of Patent: May 6, 2003

(54) TAP DEVICE OF CABLE BROADCASTING SYSTEM

(75) Inventor: Shinji Hasegawa, Nisshin (JP)

(73) Assignee: Masprodenkoh Kabushikikaisha, Nisshin (JP)

( * ) Notice: Subject to any disclaimer, the term of this patent is extended or adjusted under 35 U.S.C. 154(b) by 0 days.

(21) Appl. No.: 09/532,262

(22) Filed: Mar. 22, 2000

(30) Foreign Application Priority Data

Mar. 29, 1999 (JP) .......................................... 11-087150

(51) Int. Cl.⁷ ............................................... H04N 7/16
(52) U.S. Cl. ...................... 725/149; 725/128; 725/129; 333/101; 361/816; 174/35 R; 174/60
(58) Field of Search ................................ 725/127–128, 725/149; 333/132, 134, 136, 101, 103, 104, 116, 100; 174/35 R, 50, 59, 60; 361/816, 818

(56) References Cited

U.S. PATENT DOCUMENTS

| | | | | |
|---|---|---|---|---|
| 3,989,333 A | * | 11/1976 | Cauldwell | 439/76.1 |
| 4,578,702 A | * | 3/1986 | Campbell, III | 725/149 |
| 4,963,966 A | * | 10/1990 | Harney et al. | 725/149 |
| 5,058,198 A | * | 10/1991 | Rocci et al. | 725/149 |
| 5,194,947 A | * | 3/1993 | Lowcock et al. | 725/149 |
| 5,581,801 A | * | 12/1996 | Spriester et al. | 725/149 |
| 5,675,300 A | * | 10/1997 | Romerein | 333/100 |
| 5,763,830 A | * | 6/1998 | Hsueh | 174/60 |
| 5,892,653 A | * | 4/1999 | Nishimuta et al. | 361/643 |
| 5,990,758 A | * | 11/1999 | Matsubara | 333/100 |
| 5,994,976 A | * | 11/1999 | Tang | 333/100 |
| 6,018,278 A | * | 1/2000 | Tang | 333/100 |
| 6,023,602 A | * | 2/2000 | Kitajima et al. | 725/149 |
| 6,025,760 A | * | 2/2000 | Tang | 333/100 |
| 6,066,801 A | * | 5/2000 | Kodaira et al. | 174/41 |
| 6,067,441 A | * | 5/2000 | Pan | 725/150 |
| 6,068,511 A | * | 5/2000 | Hsiang | 439/579 |
| 6,069,315 A | * | 5/2000 | Tang | 174/50 |
| 6,072,981 A | * | 6/2000 | Inoue | 725/149 |
| 6,133,939 A | * | 10/2000 | Gresko et al. | 725/127 |
| 6,172,572 B1 | * | 1/2001 | Kajikawa et al. | 331/96 |

* cited by examiner

Primary Examiner—Andrew Faile
Assistant Examiner—Jason Chung
(74) Attorney, Agent, or Firm—Davis & Bujold, P.L.L.C.

(57) ABSTRACT

There is disclosed a tap device for branching a part of transmission signals running through a transmission line to selectively transmit branched signals to subscriber terminal devices via tap output terminals, in which signal paths for leading the transmission signals to the tap output terminals can easily and securely be shielded. Substrates provided with various circuits and the like are successively fixed to a housing member provided with tap output terminals. The housing member is provided with partition walls for surrounding the signal paths to the tap output terminals from the first substrate and separating relays disposed on the substrate. A shield cover, which can separate wiring patterns for signal input to the relays and wiring patterns for signal output via the relays, is disposed between the first and the second substrates. The second substrate is fixed to the housing member via the shield cover.

6 Claims, 7 Drawing Sheets

TAP DEVICE OF CABLE BROADCASTING SYSTEM

BACKGROUND OF THE INVENTION (i) Field of the Invention

The present invention relates to a tap device of a cable broadcasting system in which a part of transmission signal running through a transmission line leading to a terminal side from a center equipment is branched and transmitted to a plurality of subscriber terminal devices, particularly to a tap device of a cable broadcasting system in which it can be switched on the side of the center equipment whether the transmission signals are to be transmitted or not to the terminal devices.

(ii) Description of the Related Art

In a conventional cable broadcasting system such as CATV system in which broadcasting signals such as television signals are transmitted to a subscriber's terminal device via one transmission line formed of a coaxial cable, and the like, the transmission line is provided with a tap device, a so-called tap-off, for taking in signals in order to branch the broadcasting signals from the transmission line and leading the signals into the subscriber's terminal device.

Moreover, in a known tap device, it can easily be switched according to a subscriber's request or the like whether or not the broadcasting signals are distributed to the subscriber's terminal device.

Specifically, the tap device is provided with a relay, a so-called high-frequency relay, disposed in a signal path between a directional coupler for branching a part of the broadcasting signals from the transmission line and a tap output terminal for outputting the branched broadcasting signals toward the subscriber's terminal device, in which high-frequency broadcasting signals can be passed with a reduced loss. By operating the relay in response to a command signal transmitted from the center equipment via the transmission line, the connected/disconnected state of the signal path, in other words, whether or not the broadcasting signals are outputted to the terminal device, can easily be switched on the side of the center equipment.

Additionally, since this type of tap device is usually disposed outdoors, a directional coupler, a relay operating control circuit, and the like are all incorporated in a conductive sealed housing.

Therefore, a noise generated by the switching of the relay, or a noise from the relay operating control circuit easily enters the broadcasting signal path for leading the broadcasting signals branched from the transmission line by the directional coupler to the tap output terminal, and the broadcasting signals outputted from the tap output terminal is deteriorated in some cases.

On the other hand, to solve such problems, various shield materials may be used to shield the signal path of the broadcasting signals.

However, there is a tap device in which not only the broadcasting signals flowing through the transmission line are branched but also the branched broadcasting signals are further split and outputted from a plurality of tap output terminals, respectively. In this tap device, the broadcasting signal paths of the same number as that of the tap output terminals are formed, and relays are disposed on the respective paths. Therefore, it is difficult to shield each signal path using a shield material in order to prevent the leakage of the high-frequency broadcasting signals in a limited space.

Specifically, since the tap devices are arranged in series on the transmission line of the CATV system or the like, the size reduction is required, and the enlargement of the volume of the sealed housing is limited. On the other hand, in the tap device provided with a plurality of tap output terminals, the number of components such as relays to be incorporated in the sealed housing is increased. As a result, in the tap device provided with a plurality of tap output terminals, the housing has therein little space left for housing the shield material, and it is difficult to shield each signal path using the shield material.

Moreover, when a plurality of relays are arranged in the housing, in a circuit substrate with these relays mounted thereon, the leakage of high-frequency broadcasting signals is caused by the capacity coupling between wiring patterns forming the broadcasting signal paths, or between the wiring patterns and the relays. In this case, even when some of the relays are turned off, the broadcasting signals are disadvantageously outputted from the corresponding tap output terminals.

SUMMARY OF THE INVENTION

Wherefore, an object of the present invention is to provide a tap device of a cable broadcasting system for branching a part of transmission signals running through a transmission line and selectively transmitting the signals to subscriber terminal devices via a plurality of tap output terminals, in which a signal path for leading the transmission signals to each tap output terminal can easily and securely be shielded.

To achieve this and other objects, according to one aspect of the present invention, there is provided a tap device which includes a first housing member provided with a pair of input and output terminals for connecting the tap device to a transmission line leading to the terminal side from the center equipment of a cable broadcasting system, and a second housing member provided with a plurality of tap output terminals for branching and transmitting transmission signals running through the transmission line of the cable broadcasting system to subscriber terminal devices. These housing members have openings which can be connected with each other. By combining the housing members via the openings, a sealed housing is formed.

Moreover, the following three types of circuit substrates are disposed in the sealed housing formed of the first and second housing members:

(1) a directional coupler substrate provided with a directional coupler for connecting the input and output terminals and passing the transmission signals between these terminals while branching a part of the transmission signals;

(2) a splitter substrate provided with a splitter for splitting the transmission signals branched by the directional coupler and transmitting the signals to the tap output terminals, and a plurality of relays for connecting/disconnecting signal paths leading to the tap output terminals from the splitter; and (3) a control circuit substrate provided with a receiving circuit for taking in the transmission signals branched by the directional coupler and receiving a command signal superimposed onto the transmission signals and directed to the tap device from the center equipment, and a control circuit for operating the relays in response to the command signal received by the receiving circuit to control the connected/disconnected state of each signal path in accordance with a command from the center equipment.

The splitter substrate, the control circuit substrate, and the directional coupler substrate are arranged and housed in this order from the second housing member.

The relays are mounted on the surface of the splitter substrate facing the second housing member. Furthermore, grounding patterns are formed to surround the relays and the connecting portions of the relays and the tap output terminals on the side of the second housing member. Disposed on the surface of the second housing member facing the splitter substrate are partition walls which surround the tap output terminals, abut the grounding patterns of the splitter substrate, and separate the relays and the connection portions of the relays and the tap output terminals.

Therefore, when these substrates are housed in the sealed housing, the signal path leading to the tap output terminal from each relay of the splitter substrate is shielded by the grounding pattern formed on the surface of the splitter substrate on the side of the second housing member and the partition wall disposed on the second housing member. Therefore, the noise generated on the side of the control circuit substrate is prevented from entering the signal path leading to the tap output terminal from each relay of the splitter substrate, and the transmission signals outputted from each tap output terminal is prevented from being deteriorated.

Moreover, the portion between the signal paths leading to the tap output terminals from the relays, or the portion between each signal path and the other relay can be shielded by the grounding pattern of the splitter substrate and the partition wall on the side of the second housing member. Therefore, the transmission signals can be prevented from leaking toward the tap output terminal which is prohibited from outputting the transmission signals by turning off the relay, from the tap output terminal which is permitted to output the transmission signals by turning on the relay.

Moreover, in the present invention, since the partition wall disposed on the second housing member is used for the shielding, the device constitution can be simpler as compared with the conventional device provided with a separate shield material. Furthermore, even when the number of tap output terminals is increased, the number of shielding components is not increased, so that the size of the device can easily be reduced.

In the tap device of the present invention, a wiring pattern for transmission signal input to each relay and a wiring pattern for transmission signal output via each relay are formed on the surface of the splitter substrate facing the control circuit substrate, a grounding pattern is formed between these wiring patterns, and a shield cover is disposed between the splitter substrate and the control circuit substrate.

Furthermore, the shield cover is provided with a plate portion which can cover the wiring patterns leading to the relays from the splitter, and a partition wall portion disposed on the surface of the plate portion on the side of the splitter substrate for abutting the grounding pattern of the splitter substrate to separate the wiring pattern for the transmission signal input to each relay and the wiring pattern for the transmission signals output via each relay.

Therefore, in the tap device of the present invention, since the wiring pattern formed on the surface of the splitter substrate facing the control circuit substrate is covered with the shield cover, the noise generated by the operations of the receiving circuit and control circuit mounted on the control circuit substrate is prevented from entering the signal path for passing the transmission signals on the side of the splitter substrate, so that the transmission signal transmitted to the subscriber terminal device from the tap output terminal can more securely be prevented from being deteriorated.

Moreover, in the splitter substrate, the grounding pattern is formed between the wiring pattern for the transmission signal input to each relay and the wiring pattern for the transmission signal output via each relay, and the shield cover is provided with the partition wall portion which abuts the grounding pattern to separate the wiring patterns. Therefore, when the relay is in an off state, the transmission signals can be prevented from leaking to the output wiring pattern from the input wiring pattern. According to the present invention, the signal isolation degree during the relay off is enhanced, and the transmission signal can more securely be prevented from leaking to the subscriber terminal device from the tap output terminal.

Additionally, in the tap device of the present invention, screw holes are made in the splitter substrate and the shield cover to simultaneously fix the splitter substrate and the shield cover to the second housing member. The splitter substrate and the shield cover are simultaneously screwed to a substrate fixing portion formed on the second housing member by inserting common substrate fixing screws into the screw holes.

Therefore, in the tap device of the present invention, when the splitter substrate and the shield cover are incorporated in the sealed housing, simply by fixing these components to the second housing member with the common screw, the components can simultaneously be positioned and fixed into the housing, so that the assembly operation of the tap device can efficiently be performed.

Additionally, in the tap device of the present invention, the substrate fixing portion for fixing the control circuit substrate is formed on the shield cover. When the control circuit substrate is fixed into the housing, the screw is inserted to the screw hole made in the position of the control circuit substrate corresponding to the substrate fixing portion, and the control circuit substrate is screwed to the substrate fixing portion formed on the shield cover.

Therefore, according to the tap device of the present invention, the number of components for housing/fixing the control circuit substrate in the closed housing is decreased, and the operation efficiency of the assembling of the tap device can be enhanced.

Specifically, in order to dispose the control circuit substrate on the splitter substrate fixed to the second housing member, a spacer needs to be disposed therebetween to prevent the substrates from contacting each other. In the present invention, however, since the shield cover functions as the spacer, a separate spacer does not need to be disposed, and the number of components can be decreased. Moreover, since the shield cover functions not only as the spacer but also as a member for fixing the control circuit substrate to the second housing member, a separate fixing member does not need to be disposed, thereby the number of components is decreased. As described above, since neither a separate spacer nor a separate fixing member is necessary, the number of processes for assembling the tap device can be decreased, and the operation efficiency can be enhanced.

On the other hand, in the tap device of the present invention, a base for fixing the directional coupler substrate is mounted on the control circuit substrate, and the directional coupler substrate is fixed to the control circuit substrate via a resin case which has an attaching portion to the base.

Therefore, according to the tap device of the present invention, the procedure for assembling the tap device includes first screwing/fixing the splitter substrate and the shield cover simultaneously to the second housing member, disposing and screwing the control circuit substrate onto the shield cover, and further fixing the directional coupler substrate. The circuit substrates are fixed to the second housing member in order by the procedure. Subsequently, the first housing member is attached to the second housing member from above, and the housing is sealed. Thus, the tap device of the present invention can be assembled extremely easily.

Additionally, the directional coupler is mounted on the directional coupler substrate. The directional coupler connects the input and output terminals disposed on the first housing member, passes the transmission signals between the terminals and branches a part of the transmission signals. When the directional coupler substrate is fixed onto the control circuit substrate fixed on the second housing member as described above, the input and output terminals on the first housing member need to be connected to the directional coupler before the first housing member is attached over the second housing member with the circuit substrates mounted thereon. To easily perform the connecting operation, connectors which can be engaged with each other are disposed on the directional coupler substrate and the first housing member. When the opening of the first housing member is connected to the opening of the second housing member, the input and output terminals on the first housing member and the directional coupler can simultaneously be connected via the connectors.

BRIEF DESCRIPTION OF THE DRAWINGS

The invention will now be described, by way of example, with reference to the accompanying drawings, in which.

DETAILED DESCRIPTION OF THE PREFERRED EMBODIMENT

Figure 1:
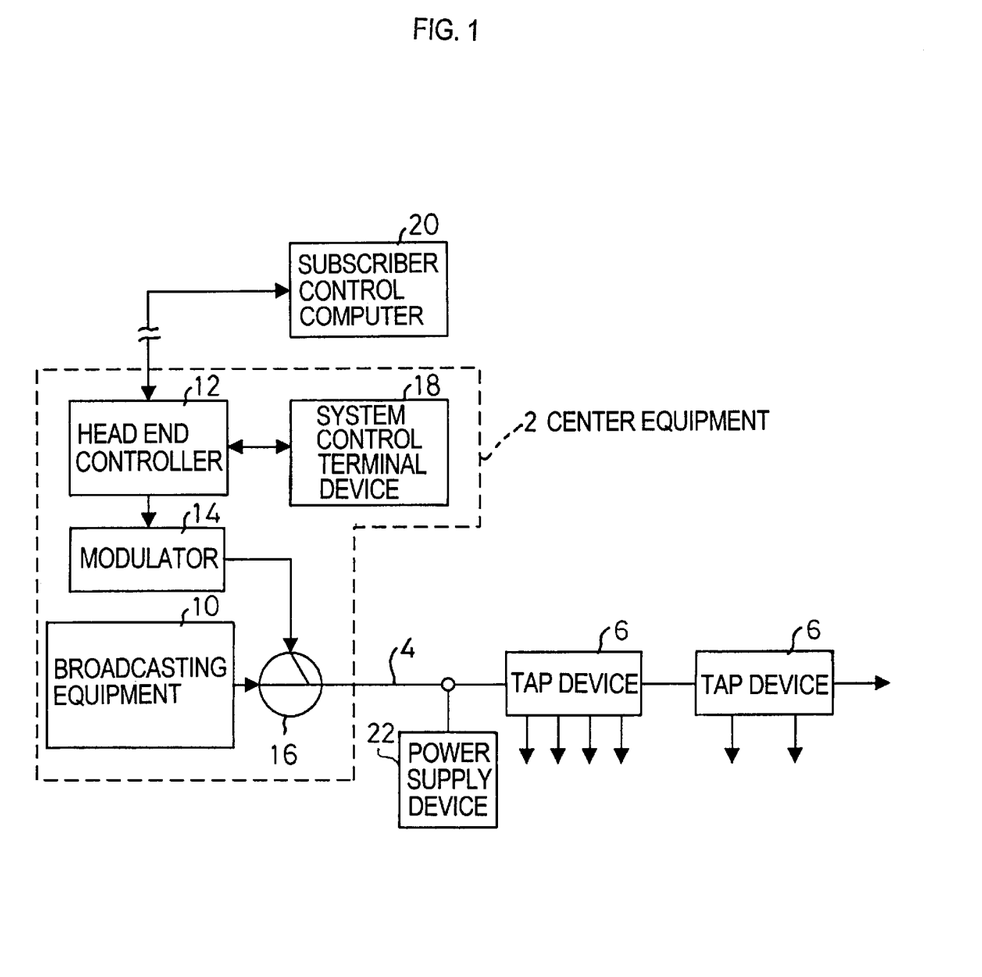
FIG. 1 is a block diagram showing the constitution of a CATV system according to an embodiment of the present invention.

As shown in FIG. 1, in the CATV system of the embodiment, the broadcasting signals of a predetermined frequency band (e.g. 54 MHz to 890 MHz) are transmitted toward a terminal side from a center equipment 2 via a transmission line 4 and distributed to system subscriber terminal devices via a large number of tap devices 6 disposed on the transmission line 4.

The center equipment 2 is provided with broadcasting equipment 10, in which a large number of television signals for broadcasting in the system are generated using receiving antennas for receiving television broadcasting signals transmitted from artificial satellites and terrestrial stations, video apparatuses for reproducing television signals recorded in video tapes and video disks, video cameras for independent broadcasting, and the like, and in which each television signal is converted to a broadcasting signal of a transmission frequency for each predetermined channel and then the broadcasting signal is sent to the transmission line 4.

The center equipment 2 is also provided with a head end controller 12 for generating transmission data including an address pre-allocated to each electronic apparatus and a command indicative of a command content to transmit a command signal for controlling the operating states of the electronic apparatuses such as the tap devices 6 disposed on the transmission line 4; a modulator 14 for converting the transmission data from the head end controller 12 to a transmission command signal of the predetermined frequency band (e.g. 70 MHz), for example, by FSK modulation; and a mixer 16 for mixing the command signal transmitted from the modulator 14 and the broadcasting signal transmitted from the broadcasting equipment 10 to send the mixed signal to the transmission line 4.

Additionally, the head end controller 12 generates the transmission data according to the command from a system control terminal device or a computer 18 disposed in the center equipment 2, or a subscriber control computer 20 connected via a telephone circuit, and the like, and transmits the command signal to various electronic apparatuses in the CATV system to control the operating states of the apparatuses. The head end controller 12 is constituted by a computer which has a communication function.

On the other hand, the transmission line 4 is connected to a power supply device 22 for supplying electricity to the tap devices 6 on the transmission line 4, amplifiers (not shown), and the like. The power supply device 22 receives electricity from a commercial power source to operate, and supplies a power signal, for example, with a frequency of 60 Hz and a voltage of about 45 V to about 90V to the transmission line 4. In consideration of the power consumption, and the like of the electronic apparatus as a power supply object, the power supply device is disposed in places at the rate of one unit for a plurality of electronic apparatuses.

The tap device 6 is a so-called tap-off disposed on the transmission line 4 in the CATV system such as a trunk directly connected to the center equipment 2, a branch line branched from the trunk via a trunk branching amplifier, a directional coupler, and the like disposed on the trunk, and a sub-branch further branched from the branch line to distribute the broadcasting signals to the subscriber terminal devices in the vicinity, and is provided with a plurality of tap output terminals. The tap device provided with four tap output terminals and the tap device provided with two tap output terminals are shown in FIG. 1.

Figure 2:
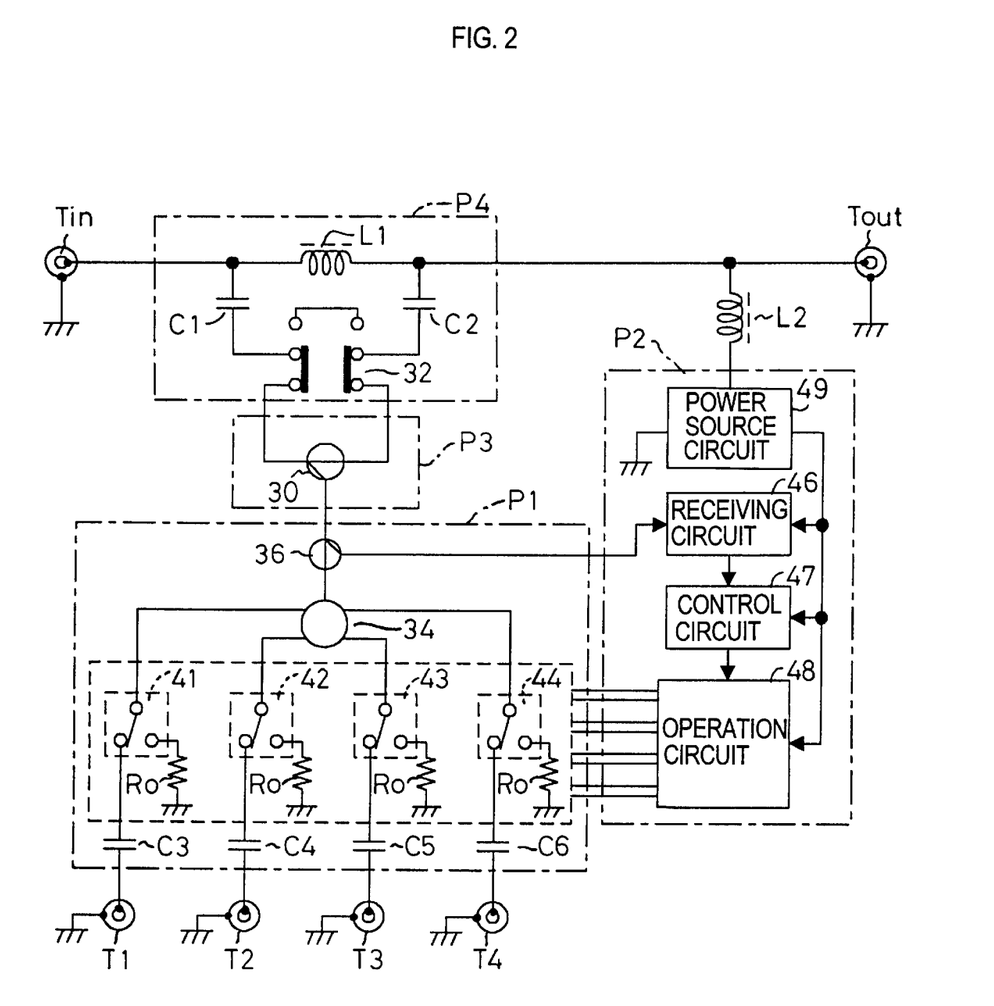
FIG. 2 is an electric circuit diagram showing the constitution of a tap device.

As shown in FIG. 2, the tap device 6 is provided with an input terminal Tin connected to the side of the center equipment 2 of the transmission line 4, an output terminal Tout connected to the terminal side of the transmission line 4, and a plurality of (four in the drawing) tap output terminals T1 to T4. Additionally, a choke coil L1 is connected between the input terminal Tin and the output terminal Tout for passing the low-frequency power signal supplied to the transmission line 4 from the power supply device 22 and for stopping the passage of the broadcasting signals and the command signal (hereinafter generically referred to as the transmission signal) transmitted to the transmission line 4 from the center equipment 2.

Furthermore, opposite ends of the choke coil L1, that is, the input/output terminals Tin and Tout are connected to one ends of capacitors C1 and C2 for cutting off the low-frequency power signal and passing the transmission signal, respectively. The other ends of the capacitors C1 and C2 are connected to a change-over switch 32 for changing between directly connecting these capacitors and connecting the capacitors via a directional coupler 30.

When the other ends of the capacitors C1 and C2 are connected to the directional coupler 30, the transmission signals transmitted via the input terminal Tin is transmitted toward the output terminal Tout, and a part of the transmission signals are branched toward the tap output terminals T1 to T4. Moreover, the choke coil L1, the capacitors C1, C2 and the change-over switch 32 are mounted on a change-over circuit substrate P4, and the directional coupler 30 is mounted on a separate directional coupler substrate P3.

Figure 3:
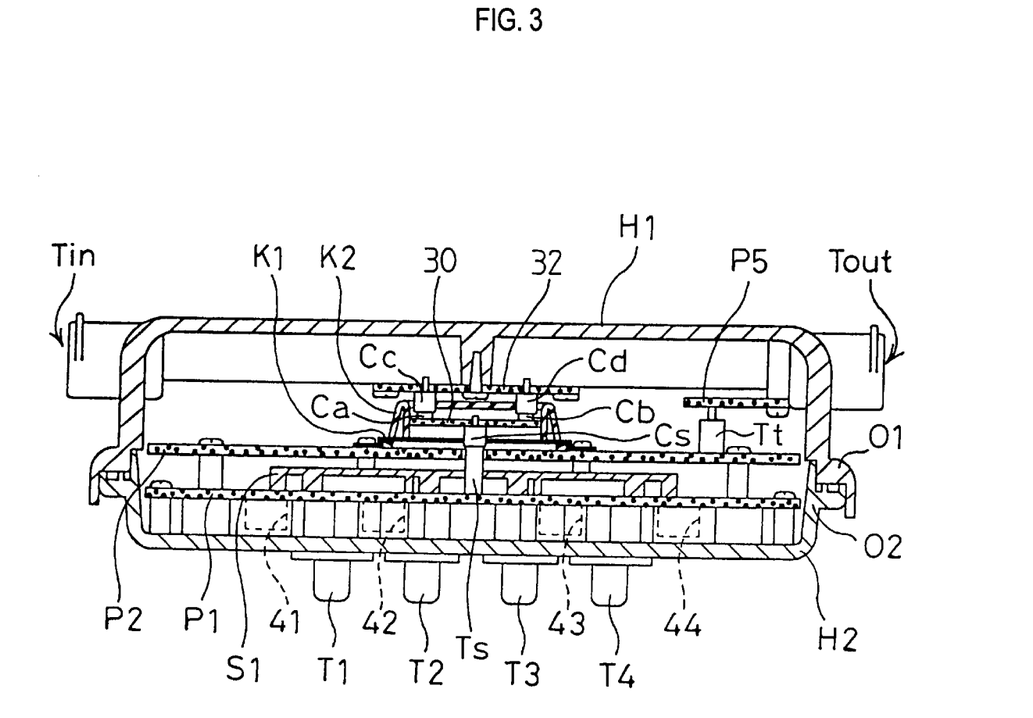
FIG. 3 is a sectional view showing a state in which circuit substrates constituting the tap device are housed into a sealed housing.

Additionally, as shown in FIG. 3, the change-over circuit substrate P4 is directly screwed to a first housing member H1, on the side walls of which the transmission line connecting plugs or coaxial cable connecting plugs constituting the input terminal Tin and the output terminal Tout are disposed. These circuit substrates P3 and P4 are also provided with pairs of disengageably engaged connectors Ca and Cb, Cc and Cd, respectively. The directional coupler 30 and the change-over switch 32 can be connected via the connectors Ca–Cc, and Cb–Cd.

Moreover, the change-over switch 32 is normally held by the force of a spring (not shown) in a position where a contact point directly connects the other ends of the capacitors C1, C2. When the directional coupler substrate P3 is attached to the change-over circuit substrate P4 via the connectors Ca to Cd, the change-over switch 32 is switched by the force from the directional coupler substrate P3 to a position where the other ends of the capacitors C1, C2 are connected to the directional coupler 30. The change-over switch 32 is an automatic change-over type switch. Therefore, when the directional coupler substrate P3 is not attached, the change-over circuit substrate P4 serves as a bypass circuit for passing the power signal and transmission signals running through the transmission line 4 via the choke coil L1 and capacitors C1, C2, and exerts no influence onto the transmission signals running through the transmission line 4.

Subsequently, the transmission signal branched by the directional coupler 30 is transmitted to a splitter 34 (a four-part splitter in the drawing), in which the signal is split in the number corresponding to the number of the tap output terminals T1 to T4. Thereafter, the split transmission signals are transmitted to the tap output terminals Ti to T4 via four capacitors C3 to C6 which pass only the transmission signals and block the passage of low-frequency power signals. The signals are then transmitted to the subscriber terminal devices connected to the tap output terminals T1 to T4 via these terminals.

Moreover, the signal paths leading to the tap output terminals T1 to T4 from the splitter 34 are provided with four latching relays (hereinafter referred to as the relays) 41 to 44 for connecting/disconnecting the signal paths, and the signal path of the transmission signals leading to the splitter 34 from the directional coupler 30 is provided with a second directional coupler 36 for branching a part of the transmission signals passing through the path. The transmission signal branched by the directional coupler 36 are transmitted to a receiving circuit 46.

The receiving circuit 46 selectively receives the command signal among the transmission signals transmitted from the directional coupler 36, and demodulates the transmission data outputted by the head end controller 12. The demodulated received data is transmitted to a control circuit 47.

The control circuit 47 is mainly constituted of a one-chip microcomputer formed of CPU, ROM, RAM, and the like. Then, upon receiving the received data from the receiving circuit 46, the control circuit 47 operates the relays 41 to 44 via an operation circuit 48 based on the received data, and switches whether or not to output the transmission signals via the tap output terminals T1 to T4.

Furthermore, the tap device 6 is provided with a power source circuit 49 connected to the output terminal Tout via a choke coil L2. The choke coil L2 takes in a part of the power signals running through the transmission line 4 toward the power source circuit 49, so that the transmission signal is inhibited from running toward the power source circuit 49. The power source circuit 49 generates a power voltage V1, for example, of AC 24V for switching on/off the relays 41 to 44, and a power voltage V2, for example, of DC 5V for operating the receiving circuit 46 and the control circuit 47 with a constant voltage from the power signal transmitted via the choke coil L2.

Specifically, the power source circuit 49 rectifies/smoothes the power signal transmitted via the choke coil L2, uses a three-terminal regulator to generate two types of power voltages V1, V2 from the rectified/smoothed power signal, supplies the relay switching power voltage V1 to the operation circuit 48, and supplies the operating power voltage V2 to the receiving circuit 46 and the control circuit 47.

Additionally, each of the relays 41 to 44 is provided with a terminal resistance Ro for terminating the signal path in the off state, so that when the relay is turned off to cut off the transmission signal path to each of the tap output terminals T1 to T4, the transmission signal is prevented from being reflected toward the splitter 34 from the open end of the signal path placed in the open state. The resistance has a resistance value corresponding to the impedance of the signal transmission system of the CATV system, which is usually 50Ω or 75Ω.

Furthermore, the splitter 34, the second directional coupler 36, the relays 41 to 44, and the capacitors C3 to C6 are mounted on the splitter substrate P1, while the receiving circuit 46, the control circuit 47, the operation circuit 48, and the power source circuit 49 are mounted on the control circuit substrate P2.

As shown in FIG. 3, the splitter substrate P1 is directly screwed to a second housing member H2 in which the transmission line connecting plugs or coaxial cable connecting plugs constituting the tap output terminals T1 to T4 are disposed. The signal paths extended via the capacitors C3 to C6 from the relays 41 to 44 for outputting the transmission signals, that is, the wiring patterns of the splitter substrate P1 for outputting the transmission signals, are connected to the central electrodes of the connecting plugs which constitute the tap output terminals T1 to T4 fixed on the side of the second housing member H2.

Moreover, the control circuit substrate P2 is disposed/fixed on the splitter substrate P1 via a shield cover S1 fixed to the second housing member H2 with the splitter substrate P1. Furthermore, the directional coupler substrate P3 is disposed/fixed on the control circuit substrate P2 via an attachment fitting K1 attached to the surface of the control circuit substrate P2 facing away from the splitter substrate P1, and a resin case K2 detachably attached to the attachment fitting K1. Additionally, the attachment fitting K1 forms the base for fixing the directional coupler substrate P3.

The control circuit substrate P2 and the splitter substrate P1 are connected to each other via a connector (not shown), so that the control circuit substrate P2 transmits a relay driving signal toward the splitter substrate P1, and conversely the transmission signals branched by the directional coupler 36 can be transmitted toward the control circuit substrate P2 from the splitter substrate P1.

Moreover, a connection terminal Ts with the same shape as that of the coaxial cable, for taking in the transmission signals branched by the directional coupler 30, is disposed on the surface of the splitter substrate P1 opposite to the control circuit substrate P2. Furthermore, an insertion hole for passing the connection terminal Ts is made in the control circuit substrate P2, and a connector Cs attachable to the tip end of the connection terminal Ts passed through the insertion hole is disposed on the surface of the directional coupler substrate P3 opposite to the control circuit substrate P2. Therefore, the output branched from the directional coupler 30 is transmitted to the splitter substrate P1 via the connector Cs and the connection terminal Ts.

Furthermore, a substrate P5 provided with the choke coil L2 connected to the output terminal Tout is fixed to the first housing member H1, and a connection terminal Tt for abutting the wiring pattern of the substrate P5 to take in the power signal from the choke coil L2 is disposed on the surface of the control circuit substrate P2 on the side of the first housing member H1. Therefore, the power signal is transmitted to the power source circuit 49 incorporated in the control circuit substrate P2 via the connection terminal Tt.

Additionally, the first and second housing members H1 and H2 have openings O1 and O2 which can engage with each other. By combining and screwing the openings O1 and O2, a sealed housing is constituted by the first and second housing members H1 and H2, which are formed by die casting of aluminum as a conductive metal.

Figure 4:
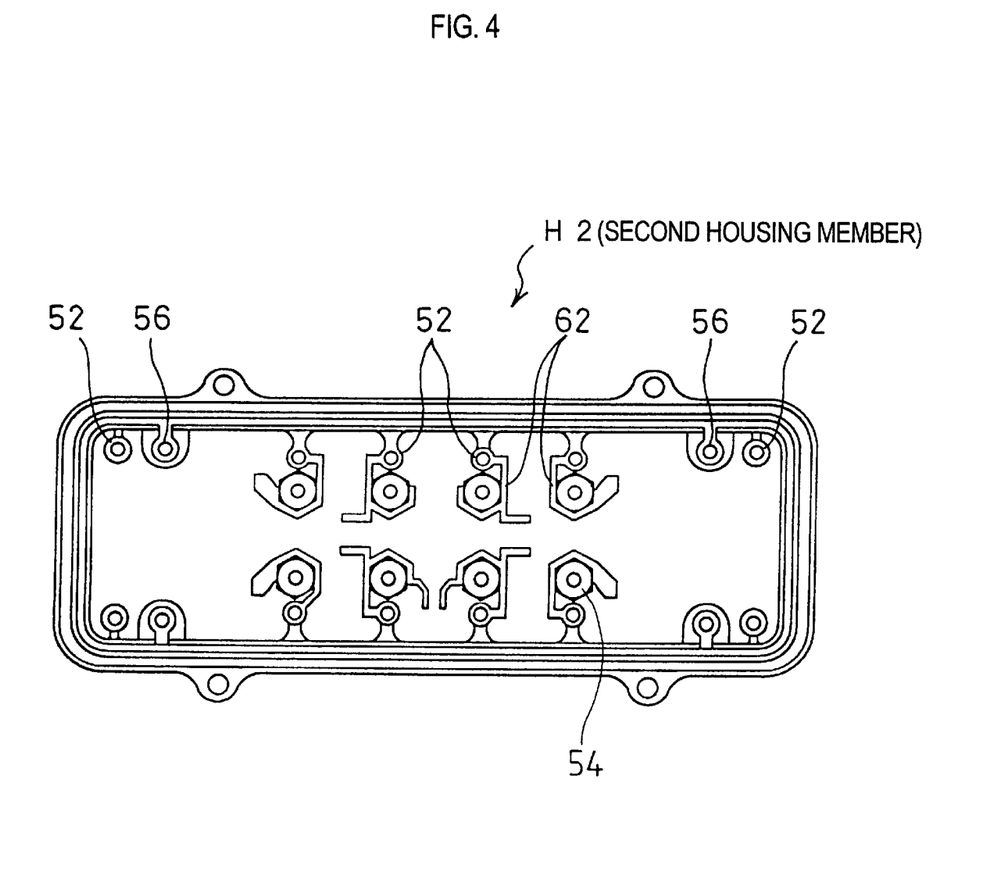
FIG. 4 is a plan view showing the inner structure of a second housing member to which the circuit substrates are fixed.

Inside the second housing member H2, as shown in FIG. 4, substrate fixing portions 52 for placing and screwing the splitter substrate Pi thereon are disposed in four peripheral corners and a central portion provided with connecting plugs which constitute the tap output terminals T1 to T4. Also in the second housing member H2, substrate fixing portions 56 for disposing and screwing the control circuit substrate P2 thereon apart from the splitter substrate P1 by a predetermined space are formed in four peripheral corners. The space is determined by the height of the shield cover S1. The control circuit substrate P2 can be fixed to the second housing member H2 using the substrate fixing portions 56 and the shield cover S1.

Additionally, in the second housing member H2, connecting plug fixing portions 54 are formed on four places in two rows at equal intervals, that is, on eight places in total, and the substrate fixing portions 52 are formed in the vicinity of the connecting plug fixing portions 54, respectively. Therefore, the splitter substrate P1 which can split the transmission signals branched by the directional coupler 30 into eight at maximum can be incorporated in the second housing member H2. When the splitter substrate P1 for splitting the transmission signal into four is incorporated, as shown in FIG. 2, unnecessary four connecting plug fixing portions 54 out of the eight are closed by blank plugs.

Figure 5:
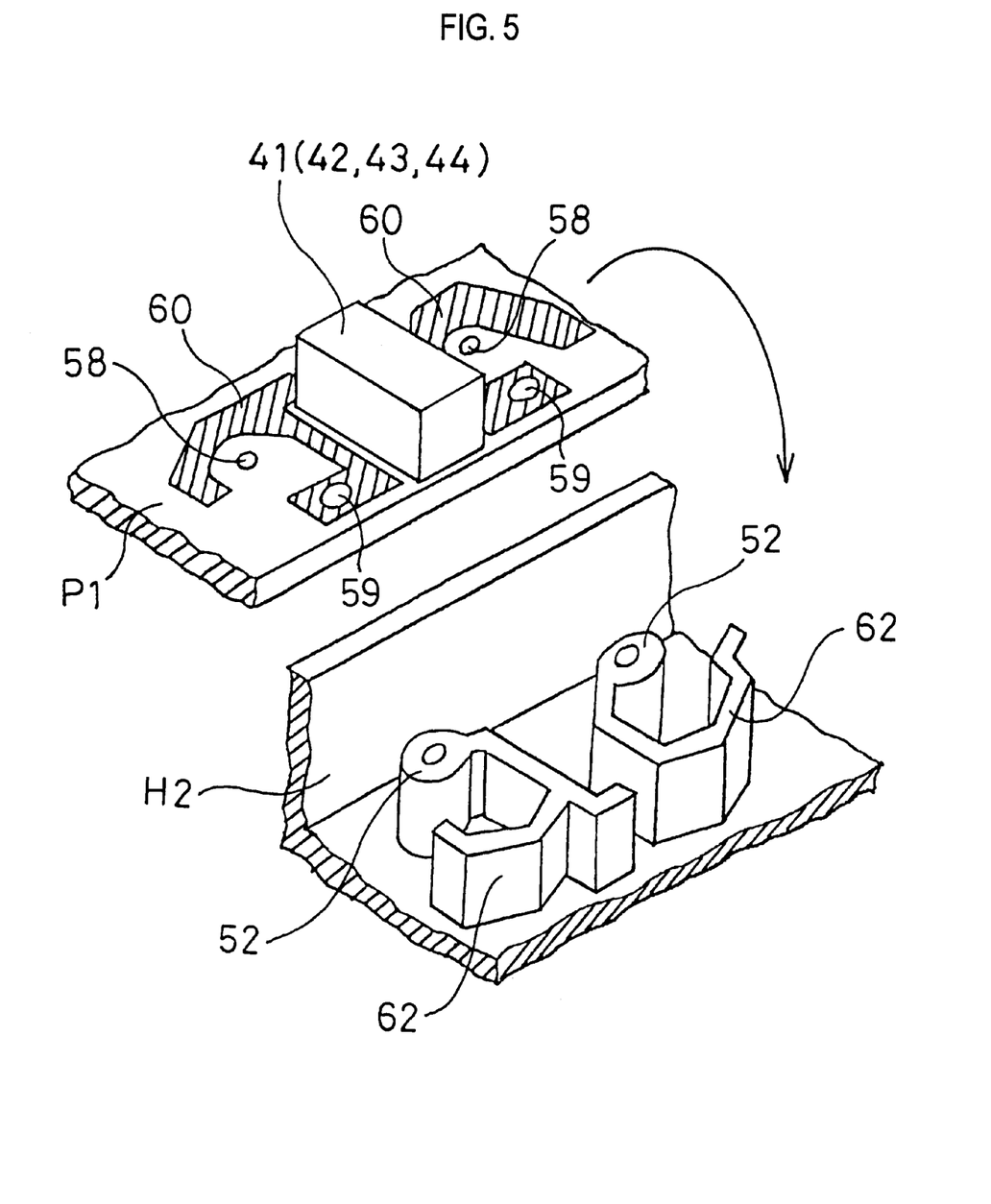
FIG. 5 is an explanatory view showing the relation of the partition wall of the second housing member and the wiring pattern of a splitter substrate.

On the other hand, when the splitter substrate P1 is provided with the eight splitter 34, eight relays 41, 42, . . . at maximum can be mounted on the splitter substrate P1 so that the split outputs from the splitter 34 can be passed/interrupted via the respective relays. Furthermore, when the splitter substrate P1 is assembled with the second housing member H2, the eight relays at maximum can be mounted in two rows at equal intervals on the substrate surface facing the second housing member H2 while avoiding the corresponding positions to the connecting plugs on the second housing member H2. As shown in FIG. 5, wiring patterns for grounding (hereinafter referred to as the grounding patterns) 60 are formed on the substrate surface to surround the mounted relays 41, 42, . . . , and insertion holes 58 to which the central electrodes of the connecting plugs, that is, the tap output terminals are inserted. Additionally, a part of the grounding patterns 60 is subjected to soldering/plating and exposed on the surface.

Moreover, partition walls are integrally formed on the surface of the second housing member H2 facing the splitter substrate P1. The partition walls surround the connecting plugs constituting the tap output terminals T1, T2, . . . , abut the grounding patterns 60 of the splitter substrate P1, and separate the relays 41, 42, . . . mounted on the splitter substrate P1 and the insertion holes 58.

Additionally, since this partition wall 62 also serves as a base for mounting the splitter substrate P1 onto the second housing member H2, the height of the partition wall 62 is set to the same height as that of the substrate fixing portion 52, and further formed continuously from the substrate fixing portion 52. Moreover, screw holes 59 for passing screws are made in the positions of the splitter substrate P1 corresponding to the substrate fixing portions 52 of the second housing member H2, and the grounding patterns 60 are also formed around the screw holes 59. By screwing the splitter substrate P1 to the substrate fixing portions 52, the grounding patterns 60 of the splitter substrate P1 can securely be connected to the second housing member H2.

Figure 6:
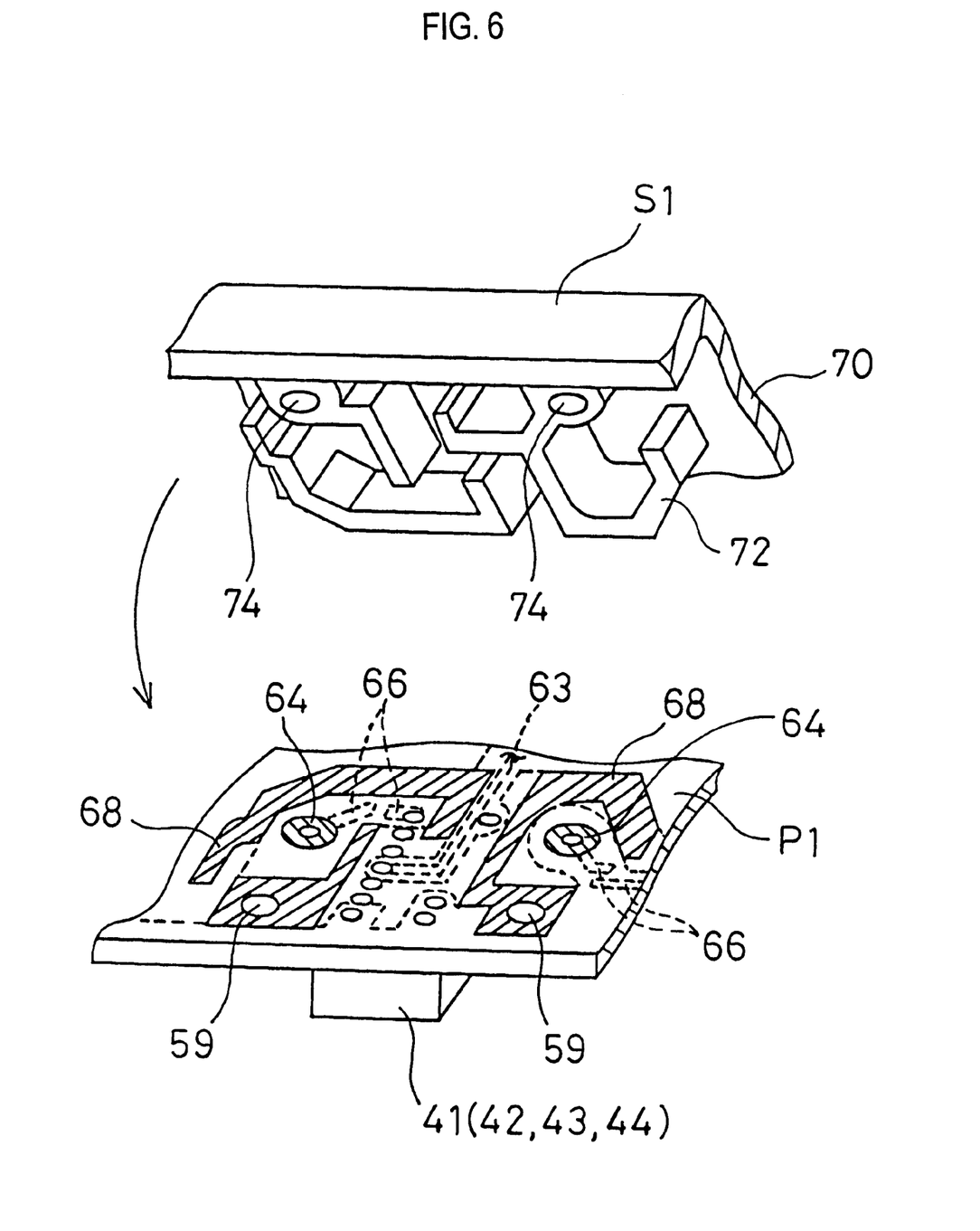
FIG. 6 is an explanatory view showing the relation of the partition wall of a shield cover and the wiring pattern of the splitter substrate.

As shown in FIG. 6, formed on the surface of the splitter substrate P1 facing away from the second housing member H2 are wiring patterns 63 constituting the input path of the transmission signals to the relays 41 to 44, wiring patterns 66 constituting the output path of the transmission signals to terminal connecting portions 64 around the insertion holes 58 from the relays 41 to 44, and other wiring patterns such as a wiring pattern for forming the splitter 34.

Furthermore, grounding patterns 68 are formed around the wiring patterns 63, 66 in the same manner as in a general high-frequency circuit substrate. Particularly, in the embodiment, the grounding patterns 68 are formed to isolate the wiring patterns 63 constituting the input path of the transmission signals and the wiring pattern 66 constituting the output path of the transmission signals. Additionally, a part of the grounding pattern 68 is exposed on the surface around the terminal connecting portion 64, and the exposed portion is plated with solder. In FIG. 6, the patterns shown by dotted lines such as the wiring patterns 63, 66 for the input/output of the transmission signals indicate the patterns on whose surfaces resist layers as insulating films are formed.

Moreover, the shield cover S1 disposed on the splitter substrate P1 is provided with a plate portion 70 which can cover the wiring patterns leading to the relays 41 to 44 from the splitter 34 in the splitter substrate P1, and partition wall portions 72 which abut the grounding patterns around the terminal connecting portions 64 plated with solder in the splitter substrate P1 to isolate the wiring patterns 63 and 66 for the input/output of the transmission signals.

Figure 7:
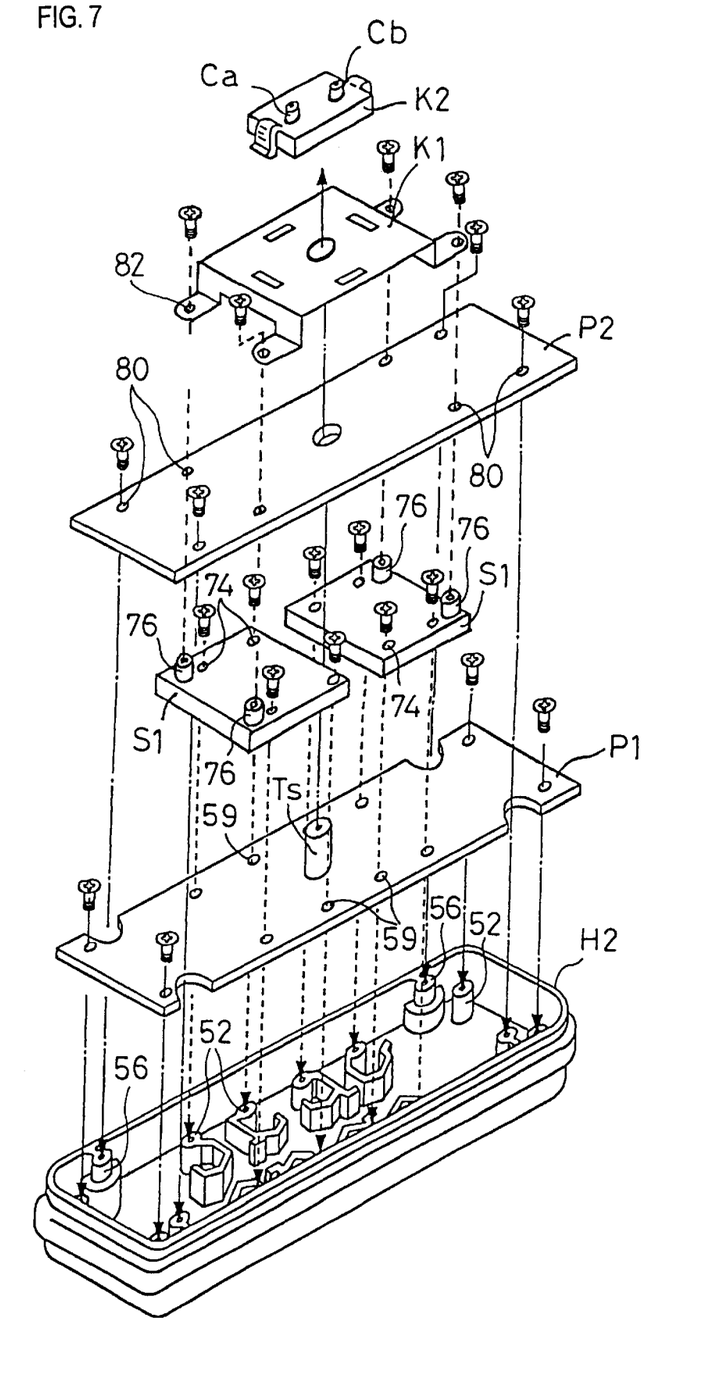
FIG. 7 is an exploded perspective view showing the procedure of fixing the circuit substrates to the second housing member.

Furthermore, screw holes 74 are made in the positions of the shield cover S1 corresponding to the screw holes 59 formed in the splitter substrate P1. As shown in FIG. 7, by inserting screws to the screw holes 74, 59 from the side of the shield covers S1, the shield covers S1 and the splitter substrate P1 can simultaneously be screwed to the substrate fixing portions 52 disposed in the middle of the second housing member H2.

The plate portion 70 and the partition wall portions 72 of the shield cover S1 are integrally formed by die casting of aluminum in the same manner as in the first and second housing members H1 and H2. Moreover, as shown in FIG. 7, the shield cover S1 is divided into two parts along the longitudinal direction of the splitter substrate P1. Each shield cover S1 can be fixed to left or right four out of the eight substrate fixing portions 52 formed in the middle of the second housing member H2.

Moreover, as shown in FIG. 7, a pair of substrate fixing portions 76 for fixing the control circuit substrate P2 are integrally formed on the left or right shield cover S1, while the control circuit substrate P2 has screw holes 80 made in the positions corresponding to the substrate fixing portions 76 and to the substrate fixing portions 56 formed on the second housing member H2. After the splitter substrate P1 and the shield covers S1 are simultaneously screwed to the second housing member H2, the control circuit substrate P2 is laid on the splitter substrate P1, and screwed to the substrate fixing portions 76, 56.

Additionally, an attachment metal plate K1 for fixing the directional coupler substrate P3 via the resin case K2 is disposed on the surface of the control circuit substrate P2 facing away from the splitter substrate P1. In the attachment metal plate K1, fixing screw holes 82 are formed in the positions corresponding to the substrate fixing portions 76 of the shield cover S1. By inserting the screws to the screw holes 80 of the control circuit substrate P2 via the screw holes 82 when screwing the control circuit substrate P2 to the shield cover S1, the attachment fitting K1 can be fixed at the same time when the control circuit substrate P2 is fixed to the second housing member H2.

As described above, in the tap device of the embodiment, the directional coupler 30 is formed on the directional coupler substrate P3, the receiving circuit 46, control circuit 47, operation circuit 48 and power source circuit 49 are formed on the control circuit substrate P2, and the splitter 34, second directional coupler 36, relays 41 to 44 and capacitors C3 to C6 are formed on the splitter substrate P1. Subsequently, these circuit substrates P1 to P3 are fixed to the second housing member H2 in this order, and housed in the sealed housing formed by the first and second housing members.

While the circuit substrates P1 to P3 are housed in the sealed housing, the transmission signal paths leading to the tap output terminals or connecting plugs T1 to T4 disposed on the second housing member H2 from the splitter substrate P1, and the paths and the relays 41 to 44 are separated by the grounding patterns 60 formed on the splitter substrate P1 and the partition walls 62 disposed on the second housing member H2. Therefore, the noises generated on the control circuit substrate P2 can be prevented from entering the transmission signal paths to the tap output terminals T1 to T4 from the splitter substrate P1 and deteriorating the transmission signals outputted from the tap output terminals T1 to T4.

Furthermore, in the embodiment, the wiring patterns 63, 66 as the input/output paths of the transmission signals to the relays 41 to 44 are formed on the surface of the splitter substrate P1 facing the control circuit substrate P2. The wiring patterns 66 for the transmission signal output and the central electrodes of the tap output terminals T1 to T4 are connected via the terminal connecting portions 64 formed on the above surface of the splitter substrate P1. The grounding patterns 68 formed around the terminal connecting portions 64 are also arranged between the wiring patterns 63 and 66 for the transmission signal input/output. Furthermore, the partition wall portions 72 of the shield cover S1 abut the grounding patterns 68. Therefore, the terminal connecting portions 64 and the wiring patterns 66 for the transmission signal output are completely separated from the wiring patterns 63 for the transmission signal input. According to the tap device of the present embodiment, the transmission signals can be prevented from leaking to the output path from the transmission signal input path to the relays 41 to 44.

Additionally, in the embodiment, when the splitter substrate P1 is screwed/fixed to the second housing member H2, the shield cover S1 is simultaneously fixed. When the control circuit substrate P2 is subsequently fixed, the control circuit substrate P2 is screwed not only to the second housing member H2 but also to the shield cover S1. Moreover, the resin case K2 housing the directional coupler substrate P3 is fixed to the attachment metal plate K1 which is fixed at the same time when the control circuit substrate P2 is screwed/fixed to the shield cover S1, so that the directional coupler substrate P3 is fixed to the second housing member H2. Therefore, the number of components necessary for housing/fixing the circuit substrates P1 to P3 in the sealed housing is reduced, and the tap device can efficiently be assembled.

Moreover, the directional coupler substrate P3 and the input and output terminals Tin, Tout on the first housing member H1 are connected via the change-over circuit substrate P4 screwed/fixed on the first housing member H1. Additionally, the circuit substrates P3 and P4 are interconnected using connectors Ca to Cd. Therefore, after the circuit substrates P1 to P3 are mounted on the second housing member H2, simply by placing the first housing member H1 over the second housing member H2, the directional coupler substrate P3 can easily be connected to the input and output terminals Tin, Tout.

What is claimed is:

1. A tap device of a cable broadcasting system, comprising: a sealed housing comprising a pair of conductive first and second housing members having openings which can be engaged with each other, said first housing member being provided with a pair of input and output terminals for connecting the tap device to a transmission line leading to a terminal side from a center equipment of the cable broadcasting system, said second housing member being provided with a plurality of tap output terminals for branching and transmitting a transmission signal running through said transmission line to subscriber terminal devices; a directional coupler for connecting said input and output terminals, passing the transmission signals running through said transmission line, and branching a part of the transmission signals; a splitter for distributing the transmission signals branched by the directional coupler and transmitting the distributed signals to said tap output terminals; a plurality of relays for connecting/disconnecting signal paths leading to said tap output terminals from the splitter; a receiving circuit for taking in the transmission signals branched by said directional coupler and receiving a command signal superimposed onto the transmission signals and directed to the tap device from said center equipment; and a control circuit for driving said relays in response to the command signal received by the receiving circuit to control connected/disconnected states of said signal paths in accordance with a command from said center equipment, said directional coupler, said splitter, said plurality of relays, said receiving circuit, and said control circuit being housed in the sealed housing, wherein a splitter substrate with said splitter and said relays mounted thereon, a control circuit substrate with said receiving circuit and said control circuit mounted thereon, and a directional coupler substrate with said directional coupler mounted thereon are arranged in order from said second housing member in said sealed housing, said plurality of relays are mounted, and grounding patterns for surrounding the relays and connecting portions of the relays and the tap output terminals on said second housing member are formed on the surface of said splitter substrate facing said second housing member, and partition walls for surrounding said tap output terminals and abutting said grounding patterns of said splitter substrate to separate said relays and the connecting portions of the relays and said tap output terminals are disposed on the surface of said second housing member facing said splitter substrate.

2. The tap device of the cable broadcasting system according to claim 1, wherein a wiring pattern for transmission signal input to said relays and a wiring pattern of transmission signal output via said relays are formed on the surface of said splitter substrate facing said control circuit substrate, and a grounding pattern is formed between the wiring patterns, and a shield cover is disposed between said splitter substrate and said control circuit substrate, said shield cover comprising a plate portion which can cover the wiring patterns leading to said relays from said splitter, and a partition wall portion disposed on the surface of the plate portion on the side of the splitter substrate for abutting the grounding pattern of said splitter substrate to separate the wiring pattern for the transmission signal input to said relays and the wiring pattern for the transmission signal output via said relays.

3. The tap device of the cable broadcasting system according to claim 2, wherein screw holes are made in said splitter substrate and said shield cover to simultaneously fix the splitter substrate and the shield cover to said second housing member, and said splitter substrate and said shield cover are simultaneously screwed to a substrate fixing portion formed on said second housing member by inserting substrate fixing screws into said screw holes.

4. The tap device of the cable broadcasting system according to claim 3, wherein a substrate fixing portion for fixing said control circuit substrate is formed on said shield cover, and said control circuit substrate is screwed to the substrate fixing portion formed on said shield cover by inserting the substrate fixing screw to the screw hole made in the position of the control circuit substrate corresponding to the substrate fixing portion of the shield cover.

5. The tap device of the cable broadcasting system according to claim 4, wherein a base for attaching said directional coupler substrate is mounted on said control circuit substrate, and said directional coupler substrate is fixed to said control circuit substrate via a resin case which has an attaching portion to the base.

6. The tap device of the cable broadcasting system according to claim 5, wherein said directional coupler substrate comprises a connector which can be attached to a directional coupler connecting connector fixed on said first housing member, and when the opening of said first housing member is engaged with the opening of said second housing member, the directional coupler substrate is connected to the input and output terminals on said first housing member via said connector.

* * * * *